(12) United States Patent
Amiri et al.

(10) Patent No.: US 11,930,719 B2
(45) Date of Patent: Mar. 12, 2024

(54) MAGNETIC MEMORY DEVICE USING DOPED SEMICONDUCTOR LAYER

(71) Applicant: Northwestern University, Evanston, IL (US)

(72) Inventors: Pedram Khalili Amiri, Wilmette, IL (US); Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 261 days.

(21) Appl. No.: 17/426,508

(22) PCT Filed: Jan. 31, 2020

(86) PCT No.: PCT/US2020/016028
§ 371 (c)(1),
(2) Date: Jul. 28, 2021

(87) PCT Pub. No.: WO2020/160358
PCT Pub. Date: Aug. 6, 2020

(65) Prior Publication Data
US 2022/0109103 A1    Apr. 7, 2022

Related U.S. Application Data

(60) Provisional application No. 62/799,685, filed on Jan. 31, 2019.

(51) Int. Cl.
*H10N 50/85* (2023.01)
*G11C 11/16* (2006.01)
*H10B 61/00* (2023.01)
*H10N 50/80* (2023.01)

(52) U.S. Cl.
CPC ............ *H10N 50/85* (2023.02); *G11C 11/161* (2013.01); *H10B 61/00* (2023.02); *H10N 50/80* (2023.02)

(58) Field of Classification Search
CPC ........ H01N 50/85; H10B 61/00; H10N 50/80; G11C 11/161
USPC .......................................... 365/158
See application file for complete search history.

(56) References Cited

U.S. PATENT DOCUMENTS

| | | | |
|---|---|---|---|
| 2005/0195646 A1* | 9/2005 | Ho | G11C 11/16 365/158 |
| 2009/0231909 A1 | 9/2009 | Dieny et al. | |
| 2018/0197915 A1 | 7/2018 | Briggs et al. | |

FOREIGN PATENT DOCUMENTS

| | | | | |
|---|---|---|---|---|
| EP | 1109169 A2 * | 6/2001 | ............. | G11C 11/15 |
| WO | WO 2019/147602 A1 | 8/2019 | | |

OTHER PUBLICATIONS

The International Search Report and the Written Opinion dated May 18, 2020 for International application No. PCT/US20/16028; pp. 1-7.

(Continued)

*Primary Examiner* — Huan Hoang
(74) *Attorney, Agent, or Firm* — Bell & Manning, LLC

(57) ABSTRACT

Magnetic memory devices are provided. The devices comprise a first ferromagnetic layer, a second ferromagnetic layer, and a tunnel barrier layer composed of a doped semiconductor (instead of an insulator or a dielectric) between the first and second ferromagnetic layers and forming at least one ferromagnetic-doped semiconductor interface.

20 Claims, 3 Drawing Sheets

(56) References Cited

OTHER PUBLICATIONS

P. Khalili et al., "The Computer Chip That Never Forgets Melding spin-based logic and memory could lead to low-power, instant-on electronics," *IEEE Spectrum* 52 (7); pp. 30-56.
C. Grezes et al, "In-plane magnetic field effect on switching voltage and thermal stability in electric-field-controlled perpendicular magnetic tunnel junctions," *Applied Physics Letters* 108 (1), 075014-1-075014 7, (2016).
P. K. Amiri et al., "Electric-Field-Controlled Magnetoelectric RAM: Progress, Challenges, and Scaling" *IEEE Transactions on Magnetics* 51 (11), 1-7 (Nov. 2015).
V. Lopez-Dominguez et al., "Picosecond Electric-Field-Induced Switching of Antiferromagnets," *Physical Review Applied* 11 (2019); pp. 024019-1-024019-6.
H. Almasi et al., "Perpendicular magnetic tunnel junction with W seed and capping layers," *Journal of Applied Physics* 121 (15), 153902-153902-6 (2017).
X. Li et al., "Thermally stable voltage-controlled perpendicular magnetic anisotrophy in MolCoFeblMgo structures," *Applied Physics Letters* 107 (14), 142403-142403-5 (2015).

* cited by examiner

MAGNETIC MEMORY DEVICE USING DOPED SEMICONDUCTOR LAYER

CROSS-REFERENCE TO RELATED APPLICATIONS

This application is a National Stage of International Application No. PCT/US2020/016028, filed Jan. 31, 2020, which claims the benefit of U.S. Patent Application No. 62/799,685, filed Jan. 31, 2019, the contents of which are herein incorporated by reference.

REFERENCE TO GOVERNMENT RIGHTS

This invention was made with government support under ECCS-1748339 awarded by the National Science Foundation. The government has certain rights in the invention.

BACKGROUND

There is a growing demand for fast and low power memory and logic devices, driven by the emergence of applications in artificial neural networks, autonomous systems, and internet of things. These applications are driving a paradigm shift of the semiconductor industry from logic-centric to memory-centric computing, where storage and processing of data are closely integrated. Memory-centric computing requires low-power and high-speed memory operation, with high integration density. However, present solutions do not scale adequately to address this demand, while some of the alternative candidates such as memristors lack the endurance to be used in applications where frequent writing is required. Spintronic devices, where current or voltage are used to control magnetic order at the nanometer scale, are exceptionally promising for this paradigm, as they combine nonvolatility (i.e. no standby power) with high endurance. While much work has been dedicated to the development of current-controlled spin-transfer torque (STT) memory, new and more efficient approaches to control magnetism have recently emerged, which provide pathways to wider industry adoption and new applications.

Voltage-controlled magnetic anisotropy (VCMA) is one of the leading candidates to replace or supplement the current-controlled write mechanism of STT. By using an electric-field-controlled write, VCMA can dramatically improve energy efficiency, improving integration density by reducing the access transistor dimensions. The write voltage depends on the sensitivity of the anisotropy to electric field, quantified as the VCMA parameter (in units of fJ/Vm). For high-density memory applications, VCMA values>500 fJ/Vm are required. However, current state of the art is typically lower than 100 fJ/Vm (i.e. write voltages ~2 V). Previous attempts at improving the VCMA coefficient have mostly focused on changes to the free layer composition and the non-magnetic seed layers of the device.

SUMMARY

Provided are magnetic memory devices and methods of using the devices. The magnetic memory devices comprise a sandwich structure of ferromagnetic layers (e.g. CoFeB, CoFe, Fe) separated by a semiconductor layer (e.g. doped $Ga_2O_3$) as a tunnel barrier layer. Such devices achieve enhanced performance and reduce write voltage and energy dissipation compared to existing magnetic tunnel junctions (MTJs).

In one aspect, magnetic memory devices are provided. The devices comprise a first ferromagnetic layer, a second ferromagnetic layer, and a tunnel barrier layer composed of a doped semiconductor (instead of an insulator or a dielectric) between the first and second ferromagnetic layers and forming at least one ferromagnetic-doped semiconductor interface. Methods of using the magnetic memory devices are also provided.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure are described with reference to the following drawings.

DETAILED DESCRIPTION

Provided are magnetic memory devices and methods of using the devices.

The present disclosure is based on a fundamentally new approach to engineering VCMA in magnetic memory devices involving engineering the entire band structure of the device (as opposed to considering just dielectric constant or spin-orbit coupling). The approach involves using a semiconductor layer (e.g., a doped wide-bandgap semiconductor such as n-type or p-type $Ga_2O_3$) as the tunnel barrier layer (as opposed to an insulating or a dielectric material such as commonly used MgO). Thus, as used herein, the term "semiconductor" excludes insulating/dielectric materials. The approach originates from the inventors' insight that such a semiconductor layer forms a Schottky barrier at the interface with an adjacent ferromagnetic layer. This creates a built-in electric field, which in turn, plays a significant role in determining the magnetic anisotropy and its electric field dependence via the Rashba-Edelstein effect. Moreover, the height of the Schottky barrier, and thus the built-in electric field, can be tuned via the doping level of the semiconductor material. This, in turn, provides for control over both the symmetry and the magnitude of the VCMA parameter.

Figure 1:
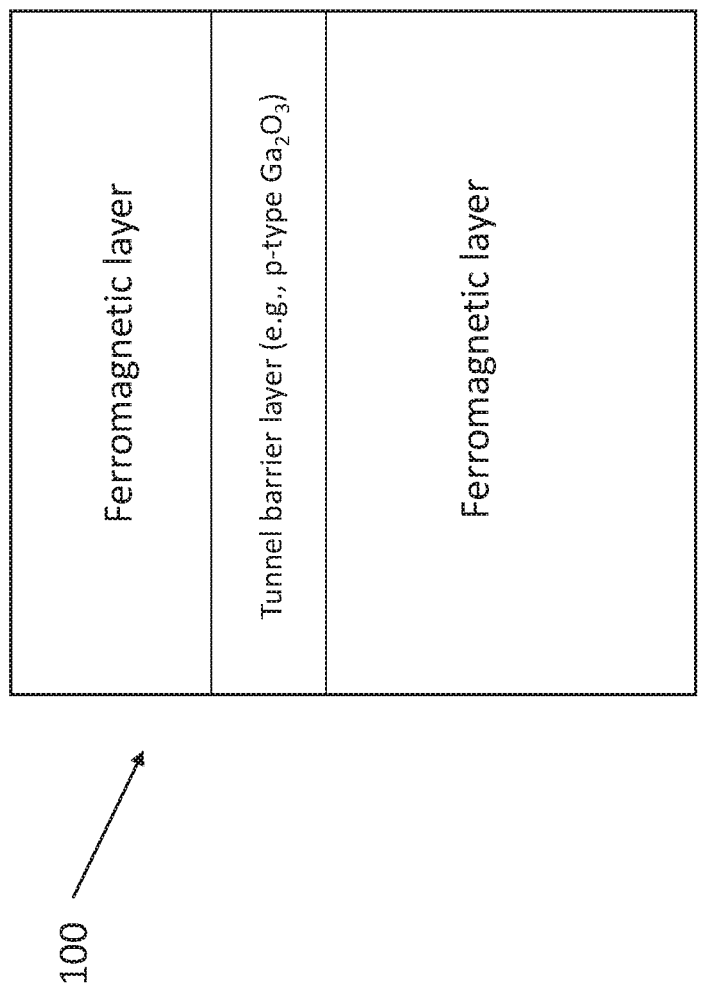
FIG. 1 is a schematic showing an illustrative magnetic memory device comprising two ferromagnetic layers separated by a semiconductor layer.

The magnetic memory devices comprise a first ferromagnetic layer, a second ferromagnetic layer, and tunnel barrier layer composed of a semiconductor between the first and second ferromagnetic layers. An illustrative magnetic memory device 100 is shown in FIG. 1. The semiconductor layer (tunnel barrier layer) is in direct contact with at least one (and generally both) of the first and second ferromagnetic layers so as to form an interface(s) with the ferromagnetic layer(s) and thus, a Schottky barrier as described above. The semiconductor from which the tunnel barrier layer is formed is generally characterized by a wide bandgap of, e.g., at least 3 eV, at least 4 eV, at least 5 eV, or in the range of from 3 eV to 5 eV. The semiconductor may be a group III-VI compound semiconductor. The group III element may be Ga, Al, In, or combinations thereof. The VI element may be O. Thus, the semiconductor may be $(Al,In,Ga)_2O_3$, wherein the ratios of Ga, Al, In may vary, depending upon the desired properties and application. In embodiments, the semiconductor is $Ga_2O_3$.

The semiconductor from which the tunnel barrier layer is formed is generally doped and may be characterized by a doping type (i.e., n-type or p-type) and a doping level (i.e., carrier concentration). As noted above, the doping level may be selected to tune the height of the Schottky barrier formed at a semiconductor-ferromagnetic interface. This allows the built-in electric field to be tuned and thus, provides control over the symmetry and magnitude of the VCMA parameter. In embodiments, the semiconductor is a group IV-doped III-VI compound semiconductor. The IV element (the dopant) may be Si. Such a doped semiconductor may be formed using metalorganic chemical vapor deposition (MOCVD) as described in WO2019/147602, which is hereby incorporated by reference in its entirety.

Briefly, as described in WO2019/147602, a substrate may be exposed to a vapor composition comprising a group III precursor comprising a group III element (i.e., metalorganic compounds comprising any of the group III elements noted above); a group VI precursor comprising a group VI element (i.e., compounds comprising a group VI element such as water, oxygen, $N_2O$, ozone); and a group IV precursor comprising a group IV element (i.e., compounds comprising a group IV element such as $SiH_4$, tetraethylorthosilicate, $Si_2H_6$, $SiCl_4$). The exposure takes place under conditions sufficient to form the desired doped compound semiconductor via MOCVD. These conditions include selecting a certain flow ratio of the group VI precursor to the group III precursor (i.e., the ratio of a flow rate of the group VI precursor to a flow rate of the group III precursor). The flow ratio parameter allows the doping type of the compound semiconductor to be tuned from n-type to p-type, even when using the same dopant, i.e., the same group IV precursor. That is, under certain flow ratios, the group IV element of the group IV precursor substitutes for the group VI element in forming the compound semiconductor to provide a p-type IV-doped III-VI semiconductor and under other flow ratios, the group IV element of the group IV precursor substitutes for the group III element to provide an n-type IV-doped III-VI semiconductor.

As noted above, the doping level (i.e., carrier concentration) of the doped semiconductor may be adjusted. In embodiments, however, the doped semiconductor is p-type having a carrier concentration in the range of from about $10^{15}$ cm$^{-3}$ to about $10^{20}$ cm$^{-3}$, from about $10^{16}$ cm$^{-3}$ to about $10^{20}$ cm$^{-3}$, from about $10^{17}$ cm$^{-3}$ to about $10^{20}$ cm$^{-3}$ or from about $10^{18}$ cm$^{-3}$ to about $10^{20}$ cm$^{-3}$. In embodiments, the doped semiconductor is n-type having a carrier concentration in any of the ranges disclosed above.

The tunnel barrier layer is characterized by an average thickness (average refers to a thickness as determined from a number of representative locations across a surface of the tunnel barrier layer). This average thickness is sufficiently small so as to ensure tunneling across the tunnel barrier layer. In embodiments, the average thickness is not more than 3 nm, not more than 2 nm, not more than 1 nm, or in a range of from a monolayer of the semiconductor to 3 nm.

The ferromagnetic layers are both composed of a ferromagnetic material. One of the ferromagnetic layers may be configured to be a fixed ferromagnetic layer and the other may be configured to be a free ferromagnetic layer. The ferromagnetic material may be a hard or soft ferromagnetic material. In embodiments, the ferromagnetic materials for the two ferromagnetic layers may be selected from CoFeB, CoFe, and Fe.

The present magnetic memory devices may include other material layers, such as a pair of electrodes configured to apply a voltage across the device. Such electrodes may be composed of a heavy metal and may be characterized by relatively large spin-orbit coupling. For example, a first electrode may be disposed on or in electrical communication with the free ferromagnetic layer of FIG. 1 and a second electrode may disposed under or in electrical communication with the fixed ferromagnetic layer of FIG. 1 such that a voltage may be applied across the device. Such an application of voltage is able to reorient or switch the magnetization of the free ferromagnetic layer via the voltage-controlled magnetic anisotropy effect. As described above, the voltage required for this reorientation or switching is determined by the doping level of the semiconductor from which the tunnel barrier layer is formed.

Thus, also provided are methods of using the present magnetic memory devices. Such a method comprises applying a voltage across the device. The voltage may be that which is sufficient to reorient or switch a magnetization of one of the first and second ferromagnetic layers.

The present magnetic memory devices may be characterized by a VCMA parameter. In embodiments, the VCMA parameter is at least 500 fJ/Vm. This includes embodiments in which the VCMA parameter is at least 750 fJ/Vm, at least 900 fJ/Vm, at least 1000 fJ/Vm, or in a range of from 500 fJ/Vm to 1000 fJ/Vm.

The present magnetic memory devices may be used with or incorporated into other systems for a variety of applications, including but not limited to: embedded memory in processor chips; random access memory (RAM) in computers, smartphones, and servers; machine learning accelerators; wearable devices; graphics processing; edge computing; and autonomous systems (e.g. self driving cars).

Advantages of the present magnetic memory devices include, but are not limited to: reduced write voltage compared to existing magnetic tunnel junctions; voltage-induced switching, rather than current-induced switching, resulting in low power dissipation and better scaling; better scalability to devices dimensions below 20 nm.

EXAMPLE

Figure 2A:
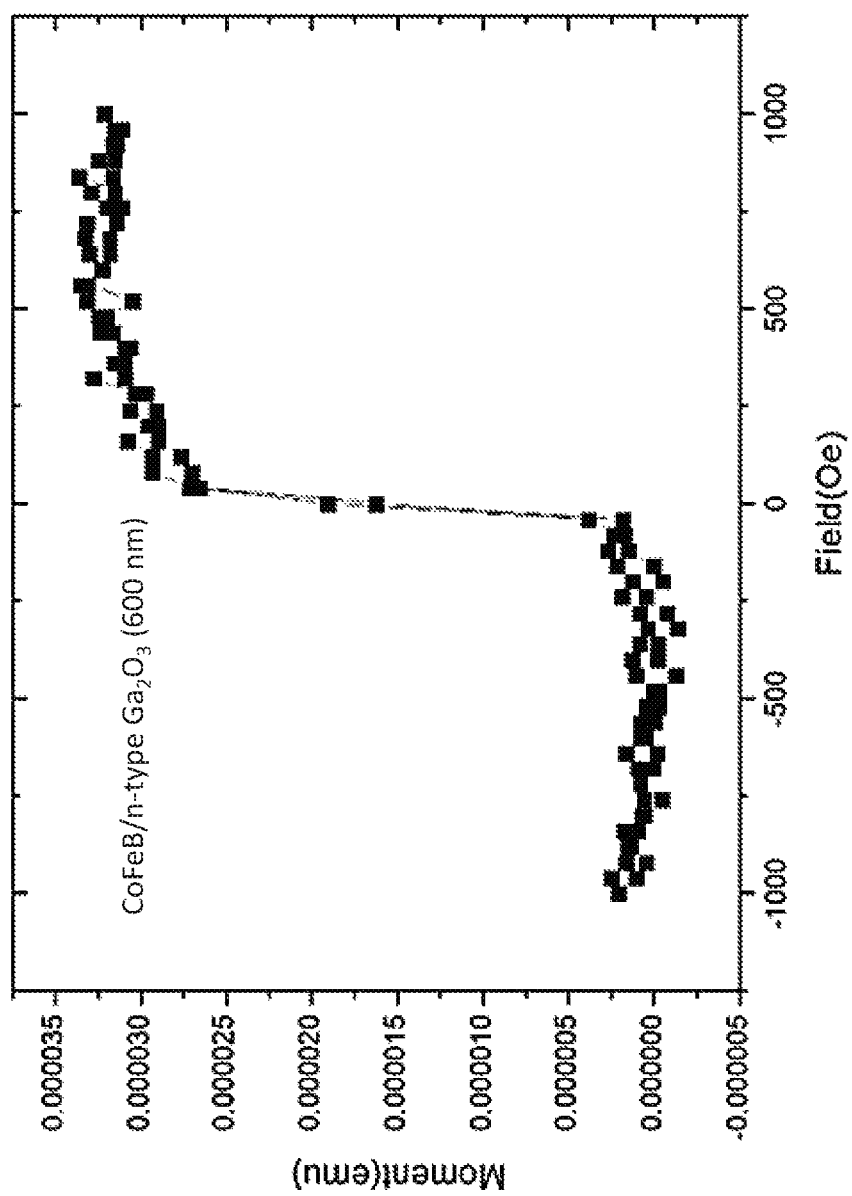
FIGS. 2A-2B show magnetic hysteresis curves measured on a CoFeB layer deposited on a 600 nm layer of n-type $Ga_2O_3$ (FIG. 2A) and a 1 nm layer of p-type $Ga_2O_3$ (FIG. 2B).
Figure 2B:
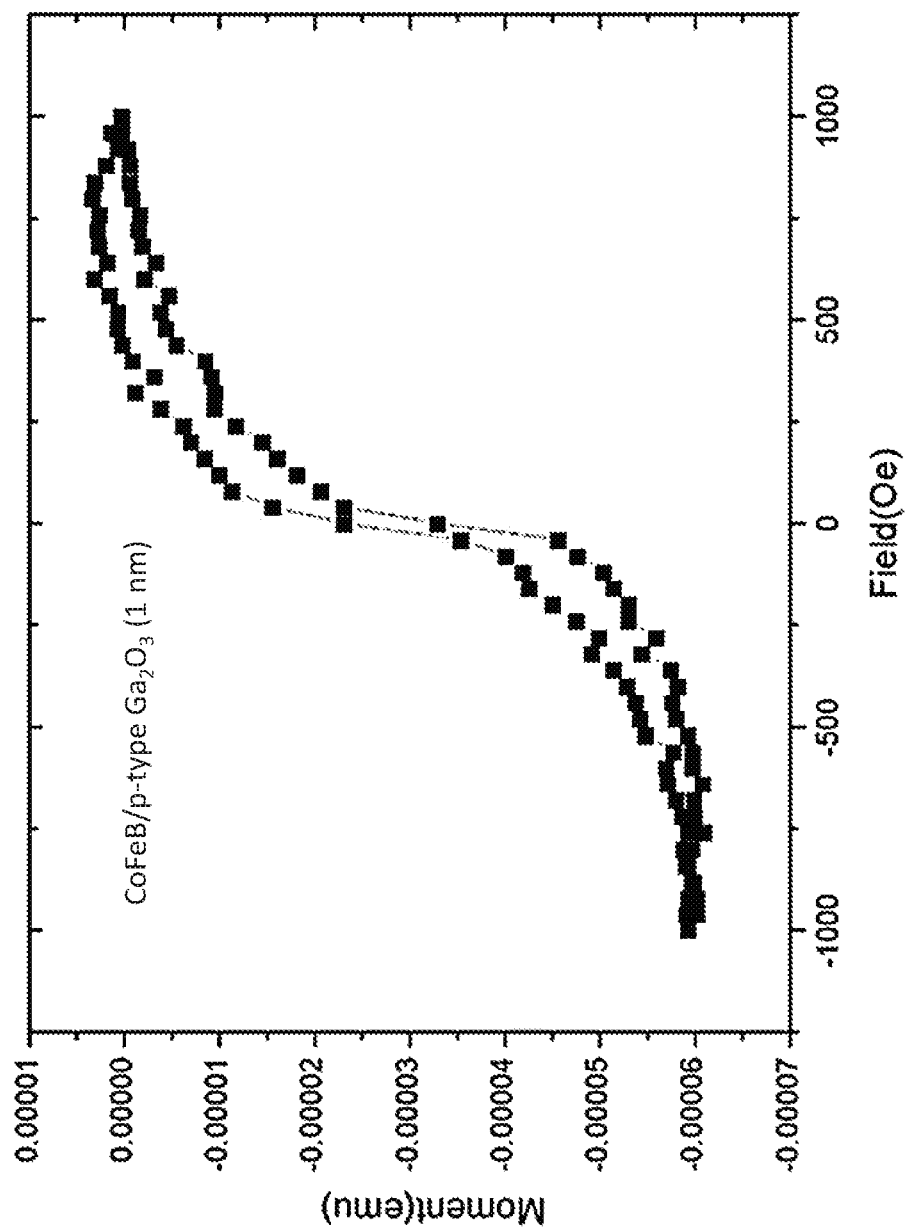

This Example investigates the application of a doped wide-bandgap semiconductor, i.e. $Ga_2O_3$, in a $Ga_2O_3$/CoFeB heterostructure for a magnetic device. Integration of doped $Ga_2O_3$ will allow for control of spin-dependent transport and magnetic anisotropy by control of the oxide doping as described above. Both n- and p-type Si-doped $Ga_2O_3$ thin films were deposited by MOCVD as described above and in WO2019/147602, incorporated by reference in its entirety. Next, thin (<2 nm) CoFeB layers were sputtered onto the Si-doped $Ga_2O_3$ thin films. Magnetic hysteresis curves were measured for the heterostructures as shown in FIGS. 2A-2B.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A magnetic memory device comprising a first ferromagnetic layer, a second ferromagnetic layer, and a tunnel barrier layer composed of a doped semiconductor between the first and second ferromagnetic layers and forming at least one ferromagnetic-doped semiconductor interface, wherein the doped semiconductor is characterized by a carrier concentration of at least $10^{15}$ cm$^{-3}$.

2. The device of claim 1, wherein the doped semiconductor has a bandgap of at least 3 eV.

3. The device of claim 1, wherein the doped semiconductor has an average thickness of no more than 2 nm.

4. The device of claim 1, wherein the doped semiconductor is a doped group III-VI semiconductor.

5. The device of claim 4, wherein the doped semiconductor is doped $(Al,In,Ga)_2O_3$.

6. The device of claim 4, wherein the doped semiconductor is a group IV-doped group III-VI semiconductor.

7. The device of claim 6, wherein the doped semiconductor is a Si-doped group III-VI semiconductor.

8. The device of claim 6, wherein the doped semiconductor is Si-doped $(Al,In,Ga)_2O_3$.

9. The device of claim 1, wherein the first and second ferromagnetic layers are independently selected from CoFeB, CoFe, and Fe.

10. The device of claim 1, further comprising a first electrode and a second electrode configured to apply a voltage across the device.

11. The device of claim 1, wherein the doped semiconductor is Si-doped $(Al,In,Ga)_2O_3$ and the first and second ferromagnetic layers are independently selected from CoFeB, CoFe, and Fe.

12. A computing device comprising a processor and the magnetic memory device of claim 1.

13. A method of using the magnetic memory device of claim 1, the method comprising applying a voltage across the device.

14. The method of claim 13, wherein the voltage is sufficient to reorient or switch a magnetization of one of the first and second ferromagnetic layers.

15. The method of claim 13, wherein the voltage required to reorient or switch a magnetization of one of the first and second ferromagnetic layers depends upon a carrier concentration in the doped semiconductor.

16. The device of claim 1, wherein the tunnel barrier layer has a composition that is the same throughout the tunnel barrier layer.

17. A magnetic memory device comprising a first ferromagnetic layer composed of CoFeB, a second ferromagnetic layer composed of CoFeB, and a tunnel barrier layer composed of a doped semiconductor between the first and second ferromagnetic layers and forming at least one ferromagnetic-doped semiconductor interface, wherein the doped semiconductor is n-type Si-doped $Ga_2O_3$ or p-type Si-doped $Ga_2O_3$.

18. The device of claim 17, wherein the doped semiconductor is characterized by a carrier concentration of at least $10^{15}$ cm$^{-3}$.

19. The device of claim 17, wherein the tunnel barrier layer has a composition that is the same throughout the tunnel barrier layer.

20. A computing device comprising a processor and the magnetic memory device of claim 17.

* * * * *